United States Patent
Bradshaw (10) Patent No.: US 11,978,813 B1
(45) Date of Patent: May 7, 2024

(54) SYSTEMS, METHODS AND APPARATUS FOR COUPLING SOLAR CELLS

(71) Applicant: Government of the United States of America as represented by the Secretary of the Air Force, Kirtland AFB, NM (US)

(72) Inventor: Geoffrey Keith Bradshaw, Albuquerque, NM (US)

(73) Assignee: United States of America as represented by the Secretary of the Air Force, Kirtland AFB, NM (US)

( * ) Notice: Subject to any disclaimer, the term of this patent is extended or adjusted under 35 U.S.C. 154(b) by 308 days.

(21) Appl. No.: 16/725,269

(22) Filed: Dec. 23, 2019

(51) Int. Cl.
*H01L 31/0352* (2006.01)
*H01L 31/0304* (2006.01)
*H01L 31/05* (2014.01)

(52) U.S. Cl.
CPC ............. *H01L 31/035236* (2013.01); *H01L 31/03046* (2013.01); *H01L 31/0512* (2013.01)

(58) Field of Classification Search
CPC ....... H01L 31/035236; H01L 31/03046; H01L 31/0512
See application file for complete search history.

(56) References Cited

U.S. PATENT DOCUMENTS

| | | |
|---|---|---|
| 4,688,068 A | 8/1987 | Chaffin et al. |
| 5,851,310 A | 12/1998 | Freundlich et al. |
| 6,147,296 A * | 11/2000 | Freundlich ...... H01L 31/035236 136/262 |
| 6,316,715 B1 * | 11/2001 | King .................... H01L 31/0304 136/261 |
| 6,372,980 B1 | 4/2002 | Freundlich |
| 2005/0247339 A1 | 11/2005 | Barnham et al. |
| 2008/0257405 A1 | 10/2008 | Sharps |
| 2009/0272438 A1 | 11/2009 | Cornfeld |
| 2016/0027940 A1 | 1/2016 | Welser et al. |

OTHER PUBLICATIONS

"Energy band gap Eg of InxGa1-xAs alloys", accessed from https://www.batop.de/information/Eg_InGaAs.html, retrieved on Apr. 20, 2022.*

Lee, Kan-Hua & Barnham, Keith & Connolly, James & Browne, Benjamin & Airey, Robert & Roberts, J.s & Fuhrer, Markus & Tibbits, T.N.D. & Ekins-Daukes, N.J . . . (2012). Demonstration of Photon Coupling in Dual Multiple-Quantum-Well Solar Cells. Photovoltaics, IEEE Journal of. 2. 68-74. 10.1109/JPHOTOV.2011.2177444.

(Continued)

*Primary Examiner* — Golam Mowla (74) *Attorney, Agent, or Firm* — AFNWC/JA; David L. Narciso (57) ABSTRACT

Systems, methods and apparatus related to a multijunction solar cell. The apparatus comprises a first sub-solar cell, a second sub-solar cell in series with the first sub-solar cell and one or more quantum wells. At least some of the quantum wells are disposed in a region of the first sub-solar cell, and have a thickness and a bandgap sized such that a bandgap in selected quantum wells are less than a bandgap of a material of the first sub-solar cell and greater than a bandgap of a material of the second sub-solar cell resulting in radiative coupling between the first sub-solar cell and the second sub-solar cell.

28 Claims, 5 Drawing Sheets

(56) References Cited

OTHER PUBLICATIONS

Lee, Kan-Hua & Barham, Keith & Roberts, J.s & Alonso Álvarez, Diego & Hylton, Nicholas & Fuhrer, Markus & Ekins-Daukes, N.J . . . (2016). Investigation of Carrier Recombination Dynamics of InGaP/InGaAsP Multiple Quantum Wells for Solar Cells via Photoluminescence. IEEE Journal of Photovoltaics. PP. 10.1109/JPHOTOV.2017.2660759.
Sayed, Islam & Carlin, Conrad & Hagar, Brandon & Colter, Peter & Bedair, S.M. (2016). Strain-Balanced InGaAsP/GaInP Multiple Quantum Well Solar Cells With a Tunable Bandgap (1.65-1.82 eV). IEEE Journal of Photovoltaics. 1-7. 10.1109/JPHOTOV.2016.2549745.
Sayed, Islam & Jain, Nikhil & Steiner, Myles & Geisz, John & Bedair, S.M. (2017). 100-period InGaAsP/InGaP superlattice solar cell with sub-bandgap quantum efficiency approaching 80%. Applied Physics Letters. 111. 082107.10.1063/1.4993888.

\* cited by examiner

SYSTEMS, METHODS AND APPARATUS FOR COUPLING SOLAR CELLS

STATEMENT OF GOVERNMENT INTEREST

The embodiments described herein may be manufactured and used by or for the Government of the United States for all governmental purposes without the payment of any royalty.

FIELD OF THE DISCLOSURE

The present disclosure relates generally to coupling solar cells and more particularly to multijunction solar cells having two or more sub-solar cells with current balancing between sub-cells.

BACKGROUND

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 27% under one sun, air mass 0 (AM0) illumination, whereas even the most efficient silicon technologies generally reach only about 18% efficiency under comparable conditions.

BRIEF SUMMARY

Embodiments described herein are directed to systems, methods and apparatus for radiative coupling between sub-solar cells resulting in current balancing.

One embodiment is directed to a multijunction solar cell apparatus for providing power to a spacecraft. The apparatus comprises a first sub-solar cell a second sub-solar cell in series with the first sub-solar cell and one or more quantum wells. At least some of the quantum wells are disposed in a region of the first sub-solar cell, and have a thickness and a bandgap sized such that a bandgap in selected quantum wells are less than a bandgap of a material of the first sub-solar cell and greater than a bandgap of a material of the second sub-solar cell resulting in radiative coupling between the first sub-solar cell and the second sub-solar cell.

BRIEF DESCRIPTION OF THE DRAWINGS

The accompanying drawings, which are incorporated in and constitute a part of this specification, illustrate embodiments of the present disclosure and, together with a general description given above, and the detailed description given below, serve to explain the principles of the present disclosure.

It should be understood that the appended drawings are not necessarily to scale, presenting a somewhat simplified representation of various features illustrative of the basic principles of the disclosure. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The present disclosure will now be described more fully hereinafter with reference to the accompanying drawings, in which preferred embodiments are shown. This disclosure may, however, be embodied in many different forms and should not be construed as limited to the embodiments set forth herein. Rather, these embodiments are provided so that this disclosure will be thorough and complete, and will fully convey the scope to those skilled in the art.

Embodiments described herein relate to improving the efficiency of multijunction solar cells composed of two or more sub-solar cells through a technique of providing automatic current balancing between sub-cells. More specifically, excess current generated in one sub-cell is transferred to another sub-cell via radiative coupling.

Figure 1:
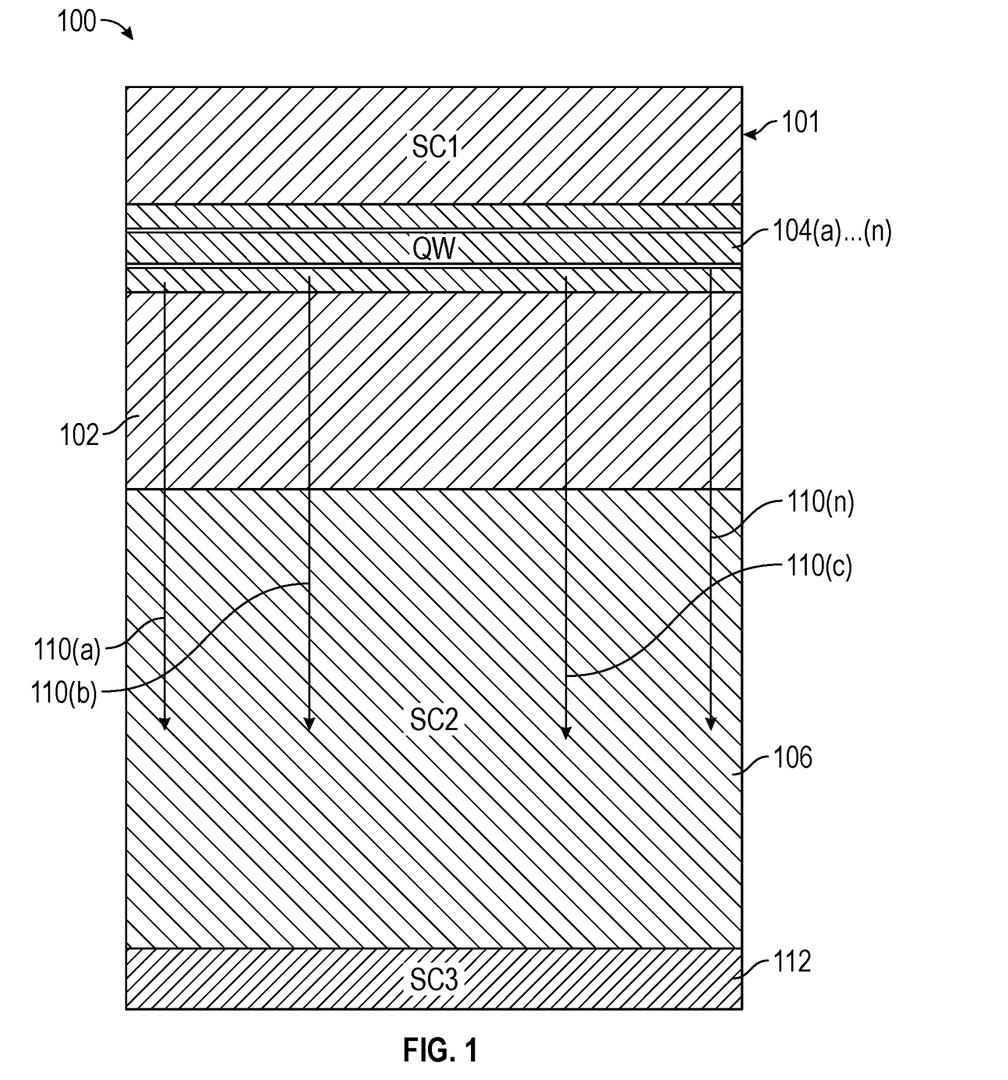
FIG. 1 is a representation of radiative coupling in a multi junction solar cell.

FIG. 1 is a representation 100 of radiative coupling in a multi junction solar cell 101.

A novel technique has been discovered that serves as a pathway to improve end-of-life (EOL) efficiency. This involves the use of radiative coupling in multijunction solar cells 101. If electron hole pairs are generated within high quality semiconductors, they may spontaneously recombine, a process called radiative recombination. Radiative recombination results in the emission of a photon of light with energy equal to the bandgap ($E_G$) of the semiconductor material.

As shown in FIG. 1, the multi junction solar cell 101 includes a first sub-solar cell 102 and a second sub-solar cell 106, which is in series with the first sub-solar cell 102. One or more nanostructures, shown for example as quantum wells, 104(a) ... (n) where "n" is any suitable number, are disposed in a region of the first sub-solar cell 102, which may be an intrinsic region of the first sub-solar cell 102 and may be adjacent to sub-solar cell 102. Photons 110(a) ... (n) where "n" is any suitable number are transferred from the nanostructures 104, generally, of the first sub-solar cell 102 to the second sub-solar cell 106. Also shown in FIG. 1 is a third solar sub-cell 112, which is located beneath the second solar sub-cell 106.

The one or more nanostructures 104, generally, which may be quantum wells, have a thickness and a bandgap sized such that a bandgap in selected nanostructures, such as quantum wells, is less than a bandgap of a material of the first sub-solar cell 102 and greater than a bandgap of a material of the second sub-solar cell 106 resulting in radiative coupling between the first sub-solar cell 102 and the second sub-solar cell 106.

The embodiments described herein improve the electrical current balancing of multijunction solar cell sub-cells 101 at end-of-life (EOL) to:
1. Intentionally transfer photons from an upper, radiation-hard, current rich sub-cell (SC1) 102 to a lower, less radiation-hard, current starved sub-cell (SC2) 106.
2. Improve end-of-life current, and thus efficiency, of SC2 106 through absorption of radiatively coupled photons 110(a) . . . (n) from SC1 102.
3. Enable a redesign of SC1 102 to achieve high beginning-of-life efficiency (BOL).

Multijunction solar cells (MJSC) 101 are the state-of-practice (SOP) for power generation on Department of Defense (DoD) and commercial spacecraft. Solar cells used on spacecraft degrade over the mission lifetime due to radiation in the space environment. As shown in FIG. 1, sub-cells 102, 106 within a multijunction solar cell 101 are optically and electrically in series with one another; therefore, the sub-cell that produces the lowest current will dictate efficiency throughout the mission lifetime. Individual sub-cells, however, do not necessarily degrade at the same rate because of differences in radiation hardness of the materials used. It has been found, and described herein, that system designers can use the EOL efficiency of the cells/array to ensure mission success for a specified duration of a mission. Higher EOL efficiency leads to smaller arrays and lower mass, both of which are potentially mission enabling and help drive down satellite launch costs.

As stated above, we have discovered a novel technique that serves as a pathway to improve EOL efficiency using radiative coupling in multijunction solar cells. We have found that when electron hole pairs are generated within high quality semiconductors, these hole pairs may spontaneously recombine through a process called radiative recombination. Radiative recombination results in the emission of a photon of light with energy equal to the bandgap ($E_G$) of the semiconductor material.

In the context of a MJSC 101, and in particular within SC1 102 as described above, a photon 110(a) . . . (n), generally 110, can be directed toward SC2 106 and subsequently absorbed by SC2 106. This is referred to as radiative coupling. Radiative coupling from e.g. SC1 102 to SC2 106, results in an increased current in SC2 106. Terrestrial MJSCs 101 designers may now take this coupling of light from SC1 102 to SC2 106 into account when designing solar cells 101 because the impact is large enough to alter current balancing between the sub-cells 102, 106.

In space solar cells, however, non-radiative recombination centers are formed due to radiation damage. Radiative recombination, and thus any radiative coupling between sub-cells 102, 106, is quenched before the cell reaches EOL conditions and does not play a role in current balancing at EOL. The current disclosure is directed to a radiation tolerant nanostructure 104, such as a quantum well, that promotes radiative coupling despite the presence of defects such that radiative coupling can boost the current of a current-limiting sub-cell (SC2) 106 at EOL conditions and improve EOL efficiency of a multijunction stack 101. As SC2 106 becomes more current limiting, excess carriers within SC1 102 will be more likely to recombine and effectively transfer more current to SC2 106 via radiate coupling.

Embodiments described herein consist of a series of quantum wells or other nanostructures 104(a) . . . (n), generally 104, incorporated into a multijunction solar cell 101 to be used as a method to auto current balance sub-cells 102, 106 or additional solar sub-cells (e.g. SC3, 112 and/or other solar sub-cells not shown). The nanostructure 104, generally, such as a quantum well, must be composed of an appropriate material and thickness such that the bandgap and the discretized energy levels within the nanostructure 104, are smaller than the surrounding material, SC1 102, but larger than the underlying sub-cell, SC2 106. The nanostructure, when a quantum well, has a thickness dimension, e.g. thickness, between approximately 10 nm and 100 nm, and typically between 10 nm and 30 nm.

As photogenerated carriers are captured in the nanostructure 104, radiative recombination will produce a photon 110 with an energy equal to the transition energy within the nanostructure 104 and lower than the bandgap of SC1 102.

FIG. 1 shows that SC1 102 will be transparent to the nanostructure 104 emission, such as a quantum well, but SC2 106 strongly absorbs photons 110 with energy higher than its bandgap. The nanostructure 104 may be a quantum well and is preferably placed within a multijunction solar cell 101 that has excess current and due to the sub-cells 102, 106 being optically in series, the nanostructure 104 may be incorporated into a sub-cell that is closer to the sun-facing surface of the multijunction solar cell 101.

Excess current in SC1 102 will depend on relative current balancing between SC1 102 and SC2 106. The more SC2 106 becomes limiting, the more SC1 102 will transfer excess current via radiative coupling. This is the concept of auto current balancing. The embodiments described herein are not limited to radiative coupling between two adjacent sub-cells 102, 106 within a multijunction solar cell 101. The concept of the disclosure may also be used to couple light to a third, or subsequent sub-cell 112 beneath SC2 106, e.g. SC3 112, if SC2 106 was transparent to the nanostructure 104 emission.

Figure 2:
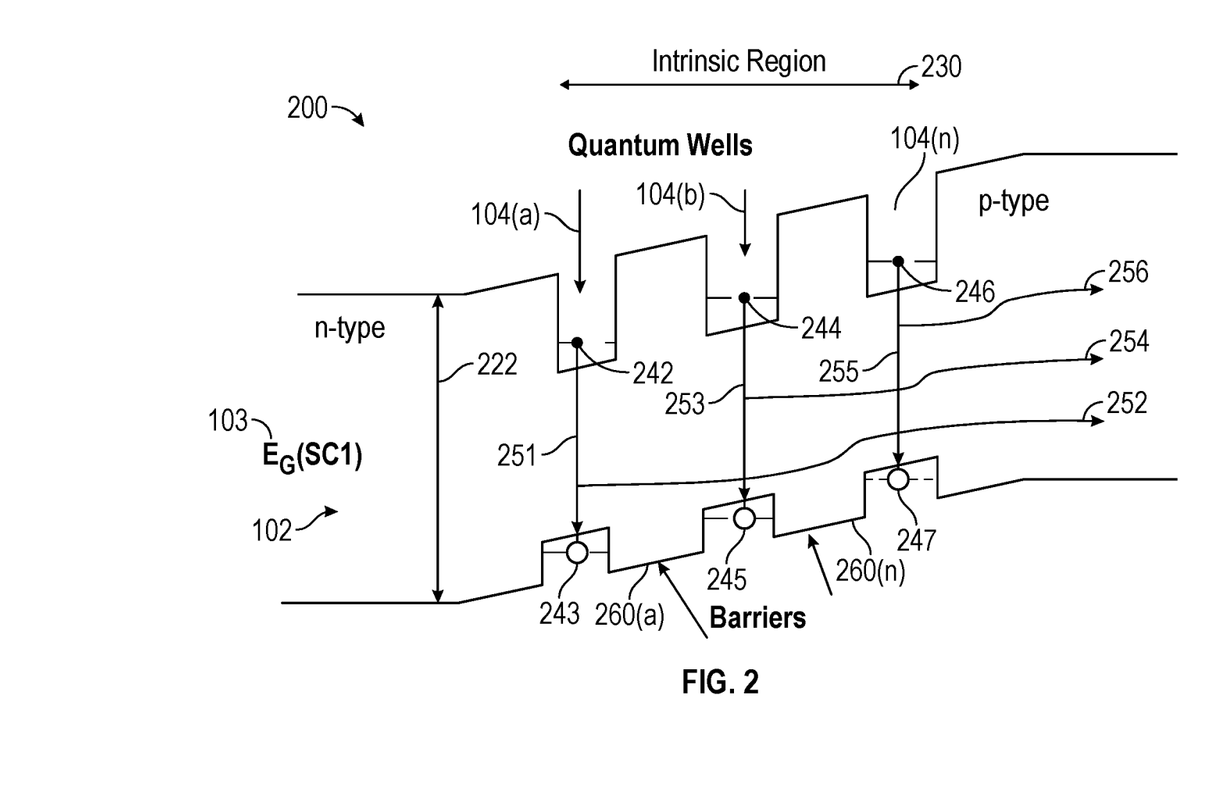
FIG. 2 is a representation of radiative recombination from quantum wells.

FIG. 2 is a representation 200 of radiative recombination from quantum wells. The nanostructure, shown as quantum well structure 104 incorporated into SC1 102 as described herein is placed within the intrinsic region 230 of a p-i-n or n-i-p solar cell 102. Carriers 242, 244, 246 generated within the QW 104(a) . . . (n) and surrounding SC1 102 material 103 may radiatively recombine within the structure to contribute to radiative coupling. The QWs 104 in this region 230 will ensure that some carriers 242, 244, 246 are captured but the electric field present in the intrinsic region 222 will sweep some carriers 252, 254, 256 across before recombining within the quantum wells 243, 245, 247. The number of QWs 104 incorporated into SC1 102 will be dictated by the ability of the QWs 104 to effectively couple light to SC2 (not shown) while minimizing impact on overall performance of SC1 102. This disclosure is not intended to specify a certain number of wells 104 as this may change based on a variety of factors depending on the design of SC1 102.

Indeed, one or more photogenerated carriers 242, 244, 246 that are captured in one or more of the one or more quantum wells 104 produce one or more photons 243, 245, 247 having an energy level equal to a transition energy within the quantum well 104 and lower than a bandgap of the first sub-solar cell 102, during radiative coupling.

Figure 3:
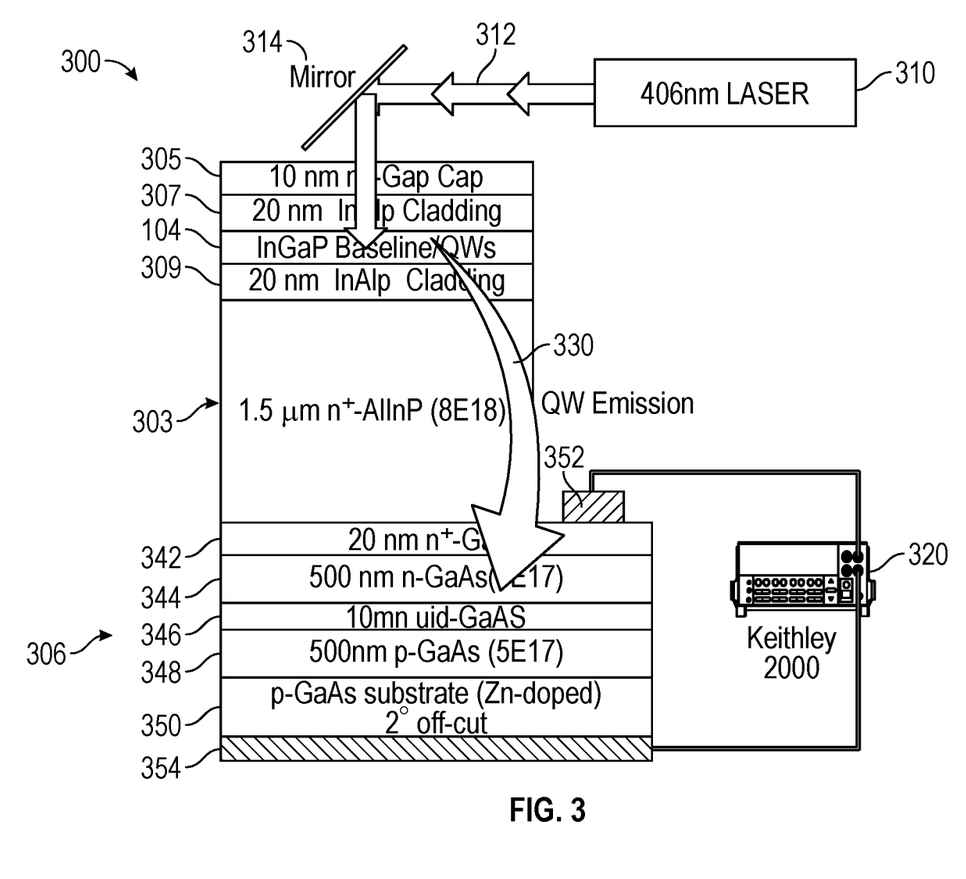
FIG. 3 is a representation of a test structure to demonstrate radiation tolerance of quantum well structures compared to InGaP bulk material.

FIG. 3 is a representation of higher radiation tolerance of quantum well structures compared to InGaP bulk material.

FIG. 3 shows an image 300 of an experiment test structure used to verify this new concept. The components of the test structure shown in FIG. 3 included laser source 310, buffer 303, SC2 306, and multimeter 320.

As shown in FIG. 3, the laser source 310 provided a laser beam, which was a 406 nm laser beam 312, which was reflected from mirror 314. The wavelength of the laser beam was a design choice and the 406 nm magnitude was used to demonstrate this novel technique.

The laser beam reflected from mirror 314 was provided to the buffer 303, which was an AlInP buffer (also sometimes referred to as InAlP buffer) that was 1.5 μm n$^+$AlInP (8E18). The buffer 303 had nanostructures 104, shown as InGaP baseline/QWs quantum wells. A 10 nm GaP cap 305, cladding 307 and cladding 309 are also shown. The emission 330 is shown as QW (quantum well) emission to SC2 306.

Above the InAlP buffer region 303 were a series of different quantum well structures 104 or a bulk InGaP material, similar to bulk material that would be used on SC1 (not shown in FIG. 3). The QWs 104 and bulk InGaP were uniformly radiated with protons at an energy of 140 keV. The InAlP buffer 303 provided a region for proton damage to scatter while keeping the GaAs solar cell 306 undamaged. The 406 nm laser 310 was used to excite carriers within the QWs 104 and InGaP bulk. Radiative recombination, and the level of coupling, was detected in the GaAs solar cell 306 using a source meter unit 320.

The test structure included a GaAs solar cell, SC2, 306, with the InAlP buffer 303 (also may be shown as InAlP buffer) on top.

The solar cell 306 included a 20 nm n+ GaAs layer 342, a 500 nm n$^-$ GaAs layer 344, 10 nm GaAs layer 346, 500 nm p$^-$ GaAs layer 348 and a p$^-$ GaAs substrate (Zn-doped 2° off-cut layer 350. The multimeter 320, was a Keithley 2000 multimeter connected to solar cell 306 via connection locations 352 and 354.

The current measured on the GaAs solar cell 306 was a measure of the effectiveness of radiative coupling.

Figure 4:
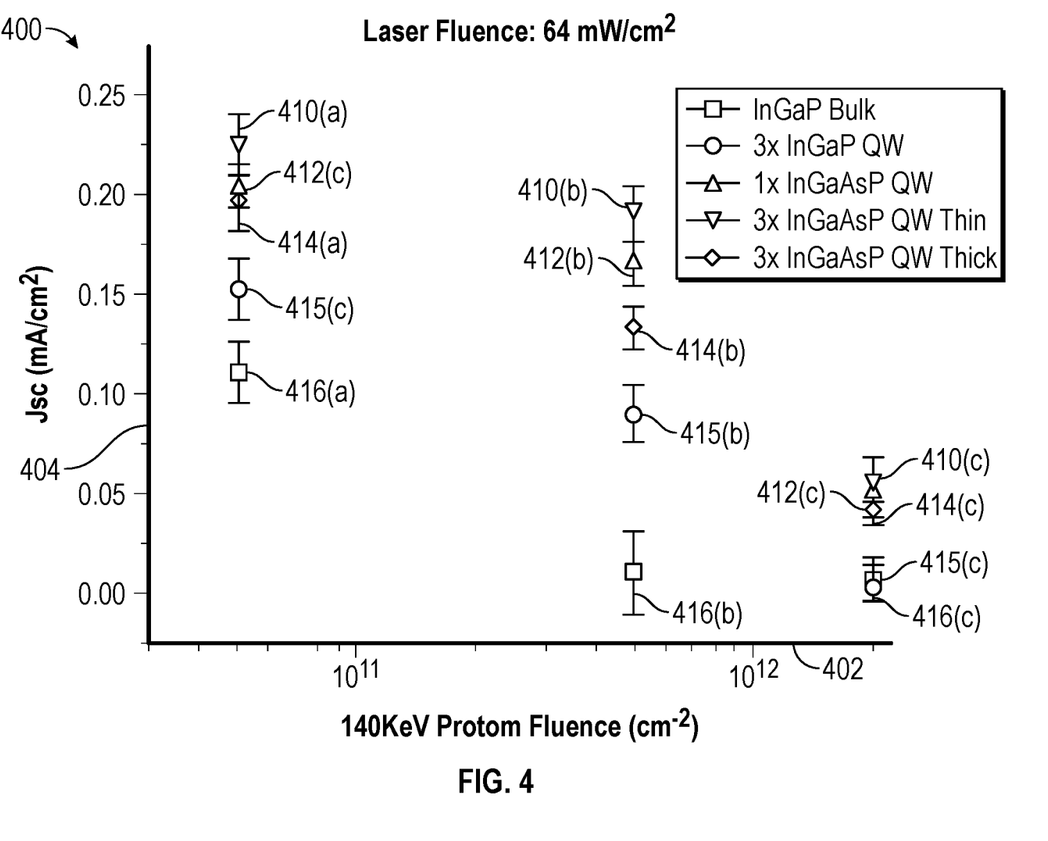
FIG. 4 shows a graph of short circuit density of a solar cell, as described herein.

FIG. 4 shows a graph 400 of short circuit density (mA/cm$^2$) of a solar cell, as described herein. Specifically, graph 400 shows short circuit density of a GaAs solar cell as a function of 140 keV proton radiation fluence, with a laser fluence of 64 mW/cm$^2$.

A 140 keV proton fluence (cm$^{-2}$) is shown on x-axis 402. Jsc (mA/cm$^2$) is shown on y-axis 404. Plot lines: InGaP bulk 416(a) and 416(b) are shown; 3×InGaP QW 414(a) and 414(b) is shown; 1×InGaAsP QW 412(a) and 412(b) are shown; 3×InGaAsP QW thin 410(a) and 410(b) are shown; and 3×InGaAsP QW thick 413(a) and 413(b) are shown.

As shown in FIG. 4, the current of the GaAs solar cell as a function proton radiation fluence, at 5e10 cm$^{-2}$, 5e11 cm$^{-2}$, and 2e12 cm$^{-2}$. The nanostructures, shown as quantum wells (QW structures) described herein, show a decrease in radiative coupling with increasing proton fluence as expected. However, the QW structures exhibit an enhanced radiative recombination with respect to the InGaP bulk baseline at all fluences. This is particularly true above 5e10 cm$^{-2}$ where the InGaP bulk exhibits zero radiative coupling. This indicates that the QW structures, as described herein, are capable of emitting light after much more damage than bulk InGaP material. Therefore, these QW structures are considered capable of promoting radiative coupling at EOL (end of life) conditions and boost the current of an SC2 sub-cell within a multijunction solar cell.

Figure 5:
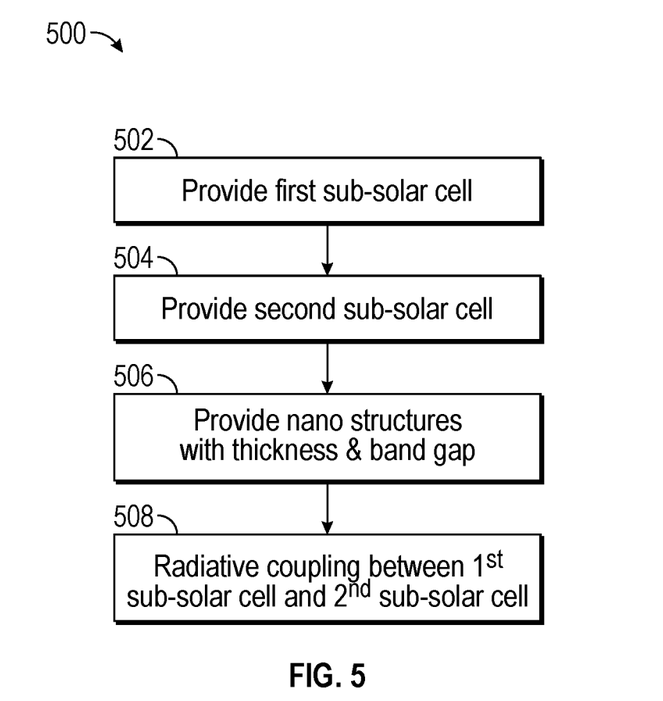
FIG. 5 shows a process for radiative coupling according to an embodiment of the disclosure.

FIG. 5 shows a process 500 for radiative coupling according to an embodiment of the disclosure.

The process 500 as shown in FIG. 5 may be used to provide power to a spacecraft or other embodiment that benefits from radiative coupling. The process 500 includes providing a first sub-solar cell as shown as 502 and providing a second sub-solar cell as shown as 504. The second sub-solar cell may be in series with the first sub-solar cell, but not necessarily. One or more nanostructures, such as quantum wells, are disposed in a region of the first sub-solar cell, the one or more nanostructures (quantum wells) having a thickness and a bandgap as shown as 506. The nanostructures are sized such that a bandgap in a selected nanostructure (quantum well) is less than a bandgap of a material of the first sub-solar cell and greater than a bandgap of a material of the second sub-solar cell. The first sub-solar cell with the nanostructures results in radiative coupling between the first sub-solar cell and the second sub-solar cell, as shown as 508.

The embodiments described herein are directed to tuning structures for improving radiative coupling between sub-cells and providing a means of auto current balancing as the current balancing between sub-cells changes over the life of a spacecraft mission. This technique will induce a boost of the overall current, and thus efficiency, of the multijunction stack.

Embodiments described herein can be fabricated by growing the structure within a standard, epitaxially grown solar cell on a substrate. Typical growth methods include, but are not limited to, metal organic chemical vapor deposition (MOCVD) or molecular beam epitaxy. The specific materials, growth or fabrication techniques, substrates or incorporation within a specific sub-cell of a multijunction sub-cell may be altered, or modified, to suit a specific need while utilizing the radiative hard radiative coupling technique, as described herein.

Alternatively, embodiments of the disclosure can make use of any number of nanostructures or materials that exhibit radiation tolerance and are capable of promoting radiative coupling in the presence of defects. Nanostructures may include quantum dots (QD), nanowires, and nanopyramids, other suitable structures, etc. These structures could be incorporated in a similar manner as those described herein. In addition, quantum structures can be made of a variety of materials. The structures in the embodiments described herein could be made from any suitable alloy including alloys of a III-V system.

Other alternatives may include non-III-V materials such as II-VI or group IV materials. Colloidal quantum dots are an advancing field that also have potential to be effective light emitters and research includes methods to utilize them in optoelectronic devices. Radiative recombination resulting from these nanostructures are desirable to perform the desired function of the quantum wells, although the ease of growth may be lower as compared with quantum wells.

Embodiments as described herein may utilize the quantum well structure within the intrinsic region of a p-i-n solar cell. This novel concept extends to any placement within a multijunction sub-cell or even outside of a sub-cell provided effective coupling occurs, and the placement of the structure is not detrimental to the performance of the multijunction solar cell as a whole.

Various embodiments of the present disclosure are described herein and include examples of the present disclosure. The embodiments described above and summarized below are combinable with one another, or any other, in any combination or permutation.

One embodiment is directed to a multijunction solar cell apparatus for providing power to a spacecraft. The apparatus comprises a first sub-solar cell a second sub-solar cell in series with the first sub-solar cell and one or more quantum wells. At least some of the quantum wells are disposed in a region of the first sub-solar cell, and have a thickness and a bandgap sized such that a bandgap in selected quantum wells are less than a bandgap of a material of the first sub-solar cell and greater than a bandgap of a material of the second sub-solar cell resulting in radiative coupling between the first sub-solar cell and the second sub-solar cell.

Another embodiment is directed to the multijunction solar cell apparatus for providing power to a spacecraft apparatus and further comprises one or more photogenerated carriers that are captured in one or more of the quantum wells produce one or more photons having an energy level equal to a transition energy within the quantum well and lower than a bandgap of the first sub-solar cell, during radiative coupling.

Yet another embodiment is directed to the multijunction solar cell apparatus for providing power to a spacecraft, where the quantum well thickness dimension is between approximately 10 nanometers to 100 nanometers.

Yet another embodiment is directed to the multijunction solar cell apparatus for providing power to a spacecraft, where radiative coupling occurs where photons are emitted from the first sub-solar cell and re-absorbed into the second sub-solar cell thereby increasing current in the second sub-solar cell.

Yet another embodiment is directed to the multijunction solar cell apparatus for providing power to a spacecraft, where the quantum well thickness dimension is based at least in part on the material of the first sub-solar cell.

Yet another embodiment is directed to the multijunction solar cell apparatus for providing power to a spacecraft, where the region is an intrinsic region of the first sub-solar cell.

Yet another embodiment is directed to the multijunction solar cell apparatus for providing power to a spacecraft, where the first sub-solar cell has a first associated electrical current and the second sub-solar has a second associated electrical current.

Yet another embodiment is directed to the multijunction solar cell apparatus for providing power to a spacecraft, where the second sub-solar is configured to couple light.

Yet another embodiment is directed to the multijunction solar cell apparatus for providing power to a spacecraft, where the second sub-solar cell is configured to be transparent to an emission from one or more quantum wells.

Yet another embodiment is directed to the multijunction solar cell apparatus for providing power to a spacecraft, where one or more of the quantum wells provide that a portion of carriers are captured in the intrinsic region and another portion of carriers are swept across the intrinsic region of one or more sub-solar cells without recombining within a quantum well.

Yet another embodiment is directed to the multijunction solar cell apparatus for providing power to a spacecraft, where the quantity of quantum wells is based in part on a design of the first sub-solar cell.

Yet another embodiment is directed to the multijunction solar cell apparatus for providing power to a spacecraft, where one or more of the first sub-solar cell and the second sub-solar cell are a GaAs sub-solar cell.

Yet another embodiment is directed to the multijunction solar cell apparatus for providing power to a spacecraft, where one or more of the first sub-solar cell and the second sub-solar cell are a InGaP sub-solar cell.

Yet another embodiment is directed to the multijunction solar cell apparatus for providing power to a spacecraft, where the first solar sub-cell is in proximity to a sun-facing surface of the multijunction solar cell.

Yet another embodiment is directed to the multijunction solar cell apparatus for providing power to a spacecraft, where a number of carriers generated in the first sub-solar cell being greater than a number of carriers generated in the second sub-solar cell.

Yet another embodiment is directed to the multijunction solar cell apparatus for providing power to a spacecraft, where the first sub-solar cell transfers at least a portion of an excess electrical current generated in the first sub-solar cell to the second sub-solar cell via radiative recombination.

Yet another embodiment is directed to an apparatus including a first sub-solar cell, a second sub-solar cell in proximity to the first sub-solar cell and one or more nanostructures, disposed within a portion of the first sub-solar cell. The one or more nanostructures having properties such that a bandgap in one or more of the nanostructures is less than a bandgap of a material of the first sub-solar cell and greater than a bandgap of a material of the second sub-solar cell resulting in radiative coupling between the first sub-solar cell and the second sub-solar cell.

Yet another embodiment is directed to the apparatus, where the first sub-solar cell transfers at least a portion of an excess electrical current to the second sub-solar cell.

Yet another embodiment is directed to the apparatus, where radiative coupling occurs where photons are emitted from the first sub-solar cell and re-absorbed into the second sub-solar cell thereby increasing current in the second sub-solar cell.

Yet another embodiment is directed to the apparatus, where the nanostructures are quantum wells.

Yet another embodiment is directed to the apparatus, where the nanostructures are disposed within an intrinsic region of the first sub-solar cell.

Yet another embodiment is directed to the apparatus, where the nanostructures are nanowires.

Yet another embodiment is directed to the apparatus, where the nanostructures are nanopyramids.

Yet another embodiment is directed to the apparatus, further comprising one or more photogenerated carriers that are captured in one or more of the nanostructures produce one or more photons having an energy level equal to a transition energy within the nanostructure and lower than a bandgap of the first sub-solar cell during radiative coupling.

Yet another embodiment is directed to the apparatus, where the nanostructure has a thickness dimension between approximately 10 nm and 100 nm.

Yet another embodiment is directed to the apparatus, where the second sub-solar cell is configured to couple light. when the second sub-solar cell is transparent to an emission from one or more nanostructures.

Yet another embodiment is directed to the apparatus, where the second sub-solar cell is transparent to an emission from one or more nanostructures.

Yet another embodiment is directed to the apparatus, where one or more of the nanostructures provide that a portion of carriers are captured in an intrinsic region and another portion of carriers are swept across the intrinsic region of one or more sub-solar cells without recombining.

Yet another embodiment is directed to the apparatus, where the quantity of nanostructures is based in part on a design of the first sub-solar cell.

Yet another embodiment is directed to the apparatus, where one or more of the first sub-solar cell and the second sub-solar cell are a GaAs sub-solar cell.

Yet another embodiment is directed to the apparatus, where one or more of the first sub-solar cell and the second sub-solar cell are a InGaP sub-solar cell.

Yet another embodiment is directed to the apparatus, where the first solar sub-cell is located in proximity to a sun-facing surface of a multijunction solar cell.

Yet another embodiment is directed to the apparatus, where the first sub-solar cell generates a first number of carriers and the second sub-solar cell generates a second number of carriers, the first number of carriers being greater than the second number of carriers.

Yet another embodiment is directed to a method for providing power to a spacecraft. The method includes providing a first sub-solar cell and providing a second sub-solar cell in series with the first sub-solar cell. The method also includes providing one or more quantum wells, disposed in a region of the first sub-solar cell, the one or more quantum wells having a thickness and a bandgap sized such that a bandgap in a selected quantum well is less than a bandgap of a material of the first sub-solar cell and greater than a bandgap of a material of the second sub-solar cell resulting in radiative coupling between the first sub-solar cell and the second sub-solar cell.

Yet another embodiment is directed to the method, further comprising: capturing one or more photogenerated carriers in one or more of the one or more quantum wells; and producing one or more photons having an energy level equal to a transition energy within the quantum well and lower than a bandgap of the first sub-solar cell during radiative coupling.

Yet another embodiment is directed to the method, where the quantum well thickness dimension is between approximately 10 nm and 100 nm.

Yet another embodiment is directed to the method, where the quantum well thickness dimension is based at least in part on the material of either the first sub-solar cell or the second sub-solar cell.

Yet another embodiment is directed to the method, further comprising: capturing a portion of carriers in the intrinsic region; and sweeping another portion of carriers across an intrinsic region of one or more sub-solar cells without recombining within any quantum well.

Yet another embodiment is directed to the method, where the quantity of quantum wells is based in part on a design of the first sub-solar cell.

Yet another embodiment is directed to the method, where one or more of the first sub-solar cell and the second sub-solar cell are a GaAs sub-solar cell.

Yet another embodiment is directed to the method, where one or more of the first sub-solar cell and the second sub-solar cell are a InGaP sub-solar cell.

Yet another embodiment is directed to the method, where the second sub-solar cell is in series with the first sub-solar cell, forming a multijunction solar cell.

Yet another embodiment is directed to the method, where the first solar sub-cell is in proximity to a sun-facing surface of a multijunction solar cell.

Yet another embodiment is directed to the method, where the first sub-solar cell generates a first number of carriers and the second sub-solar cell generates a second number of carriers, the first number of carriers being greater than the second number of carriers.

Yet another embodiment is directed to the method, further comprising transferring excess electrical current from the first sub-solar cell to the second sub-solar cell, via radiative coupling.

Those of ordinary skill in the art realize that the following descriptions of the embodiments of the present disclosure are illustrative and are not intended to be limiting in any way. Other embodiments will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the disclosure. Accordingly, the following embodiments are set forth without any loss of generality to, and without imposing limitations upon, the claims.

In this detailed description, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present disclosure.

Furthermore, in this detailed description, a person skilled in the art should note that quantitative qualifying terms such as "generally," "substantially," "mostly," "approximately" and other terms are used, in general, to mean that the referred to object, characteristic, or quality constitutes a majority of the subject of the reference. The meaning of any of these terms is dependent upon the context within which it is used, and the meaning may be expressly modified.

Some of the illustrative embodiments of the present disclosure may be advantageous in solving the problems herein described and other problems not discussed which are discoverable by a skilled artisan. While the above description contains much specificity, these should not be construed as limitations on the scope of any embodiment, but as exemplifications of the presented embodiments thereof. Many other ramifications and variations are possible within the teachings of the various embodiments. While the disclosure has been described with reference to exemplary embodiments, it will be understood by those skilled in the art that various changes may be made and equivalents may be substituted for elements thereof without departing from the scope. In addition, many modifications may be made to adapt a particular situation or material to the teachings without departing from the essential scope thereof.

Therefore, it is intended that the disclosure not be limited to the particular embodiments disclosed as the best or only mode contemplated for carrying out this disclosure, but that the disclosure will include all embodiments falling within the scope of the appended claims. Also, in the drawings and the description, there have been disclosed exemplary embodiments and, although specific terms may have been employed, they are unless otherwise stated used in a generic and descriptive sense only and not for purposes of limitation, the scope of the disclosure therefore not being so limited.

Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item. Thus, the scope of the disclosure should be determined by the appended claims and their legal equivalents, and not by the examples given.

The invention claimed is:

1. A multijunction solar cell apparatus for providing power to a spacecraft comprising:
 a first sub-solar cell comprising a material having a bandgap;

a second sub-solar cell in series with the first sub-solar cell, said second sub-solar cell comprising a material having a bandgap; and one or more quantum wells, disposed adjacent the first sub-solar cell, the one or more quantum wells having a thickness and a bandgap sized such that a bandgap in each of selected quantum wells is less than the bandgap of the first sub-solar cell and greater than the bandgap of the second sub-solar cell resulting in radiative coupling between the first sub-solar cell and the second sub-solar cell, whereby photons are emitted from the first sub-solar cell and re-absorbed into the second sub-solar cell thereby increasing current in the second sub-solar cell;

wherein there is no sub-solar cell in series preceding the first sub-solar cell.

2. The apparatus of claim 1, further comprising:

one or more photogenerated carriers that are captured in the one or more quantum wells produce one or more photons having an energy level equal to a transition energy within the one or more quantum wells and lower than the bandgap of the first sub-solar cell, during the radiative coupling.

3. The apparatus of claim 1, where the thickness of each of the one or more quantum wells is between approximately 10 nanometers to 100 nanometers.

4. The apparatus of claim 1, where the thickness of the one or more quantum wells is based at least in part on the material of the first sub-solar cell.

5. The apparatus of claim 1, where the first sub-solar cell has a first associated electrical current and the second sub-solar has a second associated electrical current.

6. The apparatus of claim 1, where the second sub-solar cell is configured to couple light.

7. The apparatus of claim 1, where the second sub-solar cell is configured to be transparent to an emission from the one or more quantum wells.

8. The apparatus of claim 1, where one or more of the quantum wells provides that a portion of carriers are captured in an intrinsic region and another portion of carriers are swept across the intrinsic region of one or more sub-solar cells without recombining within a quantum well.

9. The apparatus of claim 1, where the quantity of quantum wells is based in part on a design of the first sub-solar cell.

10. The apparatus of claim 1, where the first sub-solar cell and the second sub-solar cell are each a GaAs sub-solar cell.

11. The apparatus of claim 1, where the first sub-solar cell and the second sub-solar cell are each a InGaP sub-solar cell.

12. The apparatus of claim 1, where the first solar sub-cell is in proximity to a sun-facing surface of the multijunction solar cell.

13. The apparatus of claim 1, where a number of carriers generated in the first sub-solar cell being greater than a number of carriers generated in the second sub-solar cell.

14. The apparatus of claim 1, where the first sub-solar cell transfers at least a portion of an excess electrical current generated in the first sub-solar cell to the second sub-solar cell via radiative recombination.

15. An apparatus comprising:

a first sub-solar cell comprising a material having a bandgap;

a second sub-solar cell in proximity to the first sub-solar cell, said second sub-solar cell comprising a material having a bandgap; and one or more nanostructures, disposed within a portion of the first sub-solar cell, the one or more nanostructures having properties such that a bandgap in one or more of the nanostructures is less than a bandgap of the first sub-solar cell and greater than a bandgap of the second sub-solar cell resulting in radiative coupling between the first sub-solar cell and the second sub-solar cell, whereby the radiative coupling occurs when photons are emitted from the first sub-solar cell and re-absorbed into the second sub-solar cell thereby increasing current in the second sub-solar cell;

wherein there is no sub-solar cell in series preceding the first sub-solar cell.

16. The apparatus of claim 15, where the first sub-solar cell transfers at least a portion of an excess electrical current to the second sub-solar cell.

17. The apparatus of claim 15, where the nanostructures are quantum wells.

18. The apparatus of claim 15, where the nanostructures are disposed within an intrinsic region of the first sub-solar cell.

19. The apparatus of claim 15, where the nanostructures are nanowires or nanopyramids.

20. The apparatus of claim 15, further comprising one or more photogenerated carriers captured in one or more of the nanostructures that produce one or more photons having an energy level equal to a transition energy within the nanostructure and lower than the bandgap of the first sub-solar cell during the radiative coupling.

21. The apparatus of claim 15, where the nanostructure has a thickness between approximately 10 nm and 100 nm.

22. The apparatus of claim 12, where the second sub-solar cell is configured to couple light when the second sub-solar cell is transparent to an emission from the one or more nanostructures.

23. The apparatus of claim 15, where the second sub-solar cell is transparent to an emission from one or more nanostructures.

24. The apparatus of claim 15, where each of the provides that a portion of carriers are captured in an intrinsic region and another portion of carriers are swept across the intrinsic region of one or more sub-solar cells without recombining.

25. The apparatus of claim 15, where the quantity of the one or more nanostructures is based in part on a design of the first sub-solar cell.

26. The apparatus of claim 15, where the first sub-solar cell and the second sub-solar cell are a GaAs sub-solar cell or a InGaP sub-solar cell.

27. The apparatus of claim 15, where the first solar sub-cell is located in proximity to a sun-facing surface of a multijunction solar cell.

28. The apparatus of claim 15, where the first sub-solar cell generates a first number of carriers and the second sub-solar cell generates a second number of carriers, the first number of carriers being greater than the second number of carriers.

* * * * *